(12) United States Patent
Webb

(10) Patent No.: US 8,801,352 B2
(45) Date of Patent: Aug. 12, 2014

(54) PICK AND PLACE TAPE RELEASE FOR THIN SEMICONDUCTOR DIES

(75) Inventor: Bucknell C. Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 13/207,609

(22) Filed: Aug. 11, 2011

(65) Prior Publication Data

US 2013/0039733 A1 Feb. 14, 2013

(51) Int. Cl.
*H01L 21/00* (2006.01)

(52) U.S. Cl.
USPC ........................................ 414/416.1; 414/811

(58) Field of Classification Search
USPC ............... 414/416.09, 416.1, FOR. 108, 811
See application file for complete search history.

(56) References Cited

U.S. PATENT DOCUMENTS

| | | | | |
|---|---|---|---|---|
| 3,720,309 A * | 3/1973 | Weir | .............................. | 209/573 |
| 3,785,507 A * | 1/1974 | Wiesler et al. | .................. | 29/700 |
| 3,973,682 A * | 8/1976 | Neff | .............................. | 414/627 |
| 4,850,780 A * | 7/1989 | Safabakhsh et al. | ....... | 414/416.1 |
| 4,915,565 A * | 4/1990 | Bond et al. | ....................... | 29/740 |
| 5,589,029 A * | 12/1996 | Matsui et al. | ................. | 156/765 |
| 5,966,903 A | 10/1999 | Dudderar et al. | | |
| 6,283,693 B1 * | 9/2001 | Acello et al. | .................... | 414/403 |
| 6,751,853 B2 * | 6/2004 | Farnworth et al. | .............. | 29/743 |
| 6,824,643 B2 * | 11/2004 | Yoshimoto et al. | ........... | 156/765 |
| 7,000,966 B2 | 2/2006 | Kramarczyk et al. | | |
| 7,465,142 B2 * | 12/2008 | Yoo | .......................... | 414/416.09 |
| 7,518,240 B2 | 4/2009 | Collins et al. | | |
| 7,624,498 B2 * | 12/2009 | Ko et al. | .......................... | 29/742 |
| 7,665,204 B2 * | 2/2010 | Cheung et al. | .................. | 29/762 |
| 8,026,126 B2 * | 9/2011 | Cheung et al. | ................. | 438/106 |

FOREIGN PATENT DOCUMENTS

JP 01321650 A * 12/1989 .......... 414/FOR. 108

* cited by examiner

*Primary Examiner* — James Keenan

(74) *Attorney, Agent, or Firm* — Louis J. Percello; Ryan, Mason & Lewis, LLP

(57) ABSTRACT

Pick and place tape release techniques and tools that allow thin, fragile semiconductor dies to be removed from wafer tape with reduced tape release forces applied to the semiconductor dies. For example, a method for removing semiconductor die from wafer tape includes mounting a wafer ring having wafer tape and one or more dies attached to the wafer tape, and aligning an ejector pin assembly under a target die to be removed from the wafer tape. The ejector pin assembly includes a vacuum housing, an ejector pin, a suction plate, and an aperture formed in the suction plate in alignment with the ejector pin. A vacuum is generated in the vacuum housing to draw the tape against a surface of the suction plate. The ejector pin is extended through the vacuum housing out from the aperture of the suction plate to push against a backside of the target die and release the tape from the backside of the target die, and as the tape is released from the backside of the target die, the tape is drawn down against the suction plate by suction force of the vacuum.

19 Claims, 8 Drawing Sheets

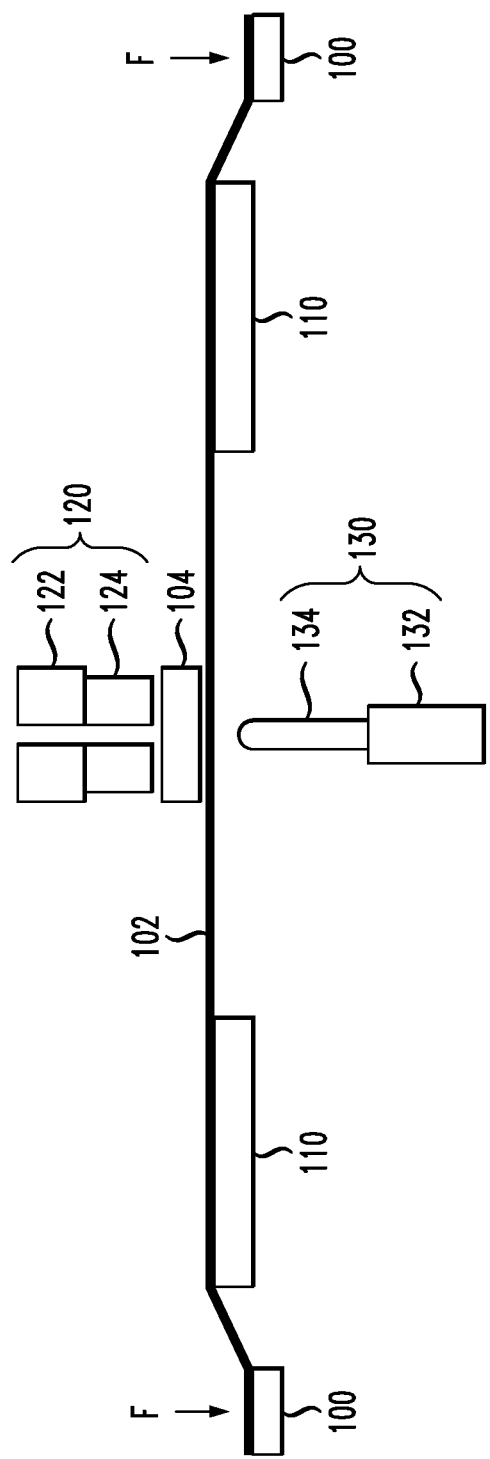

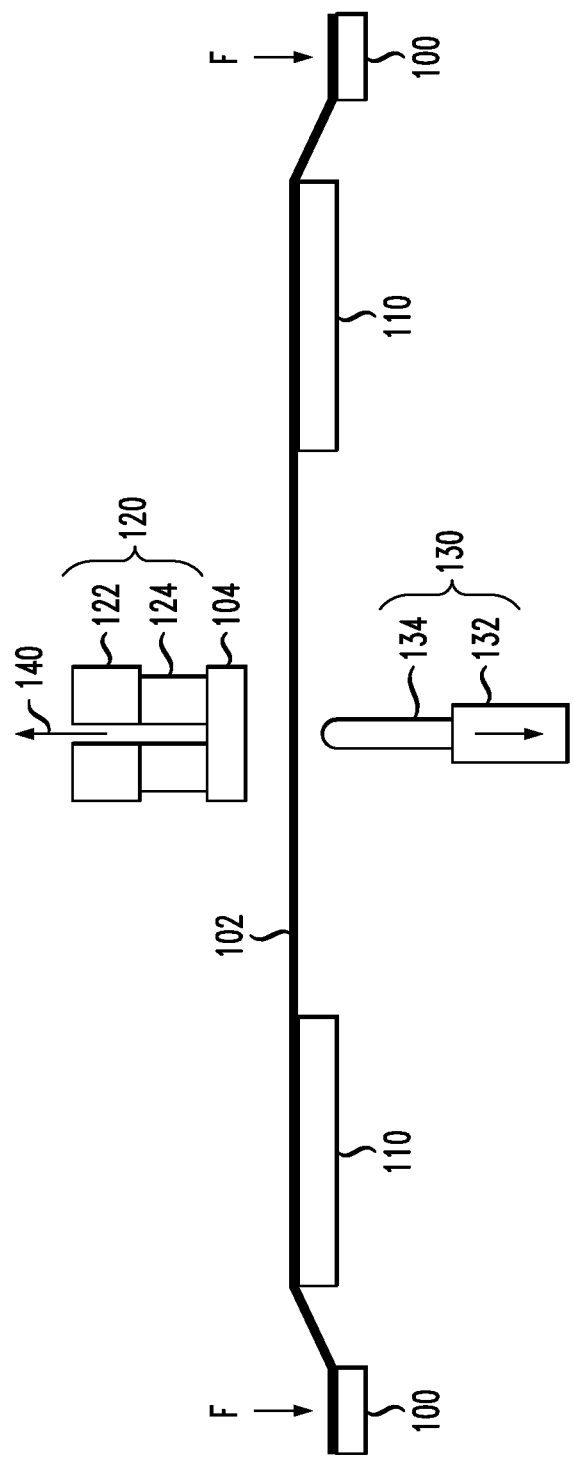

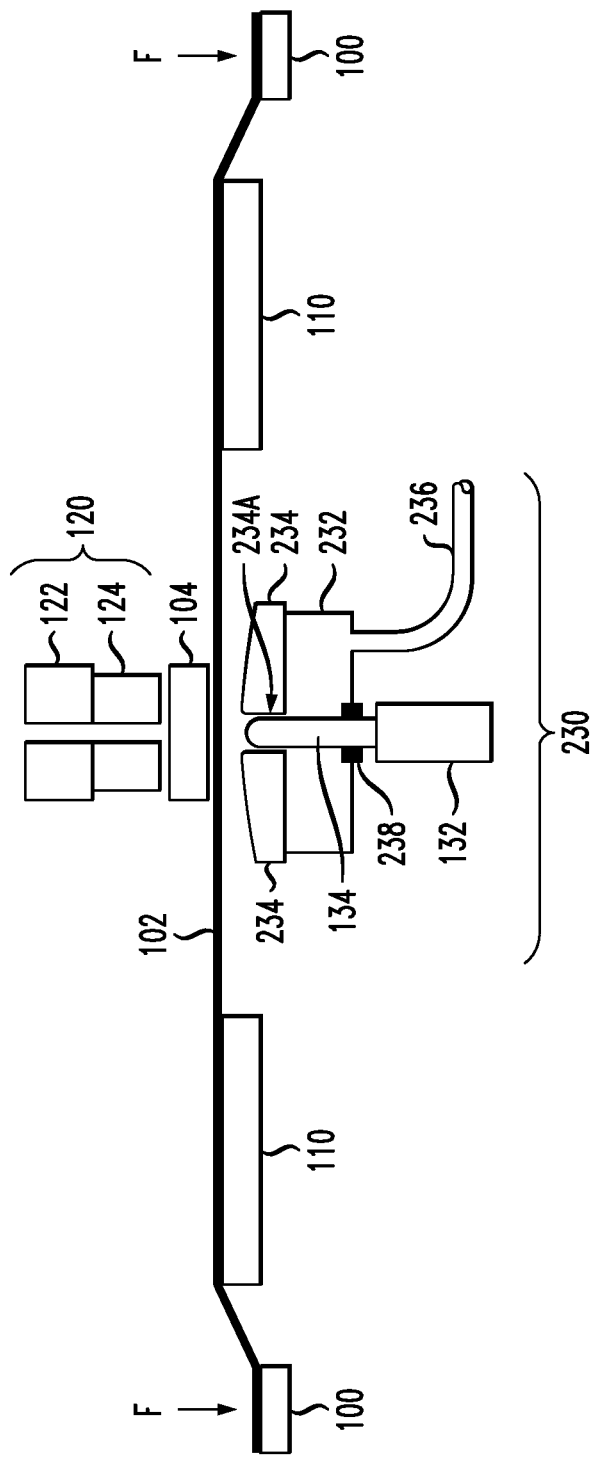

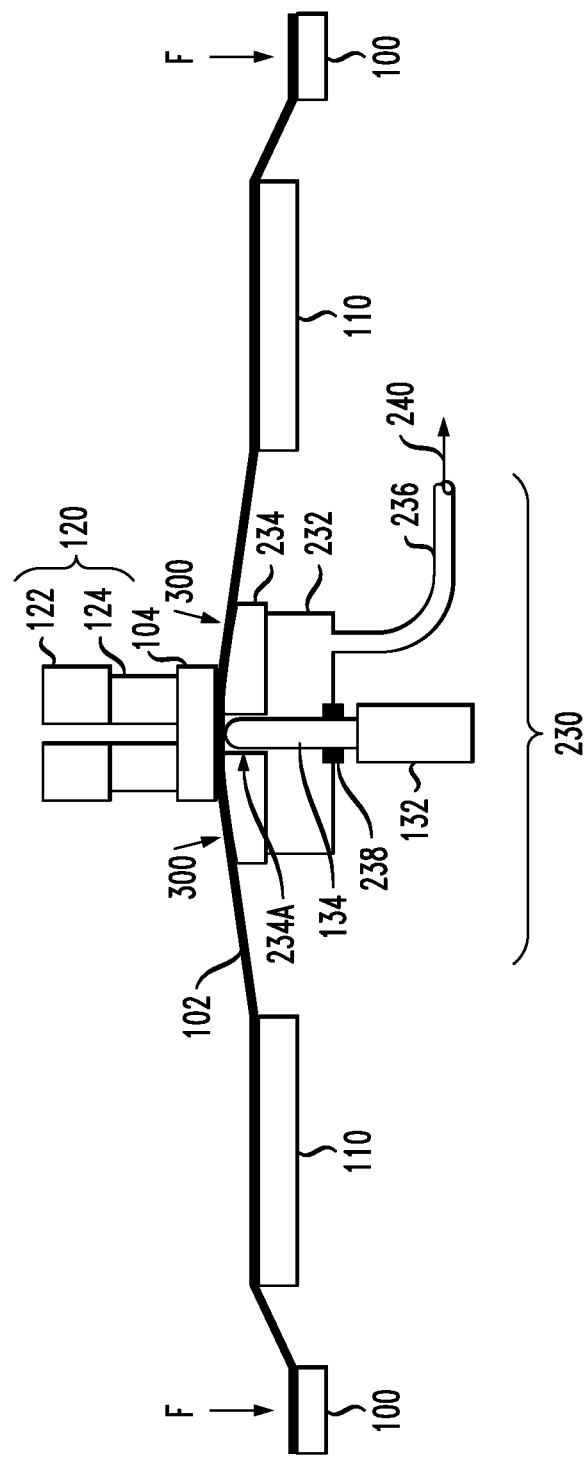

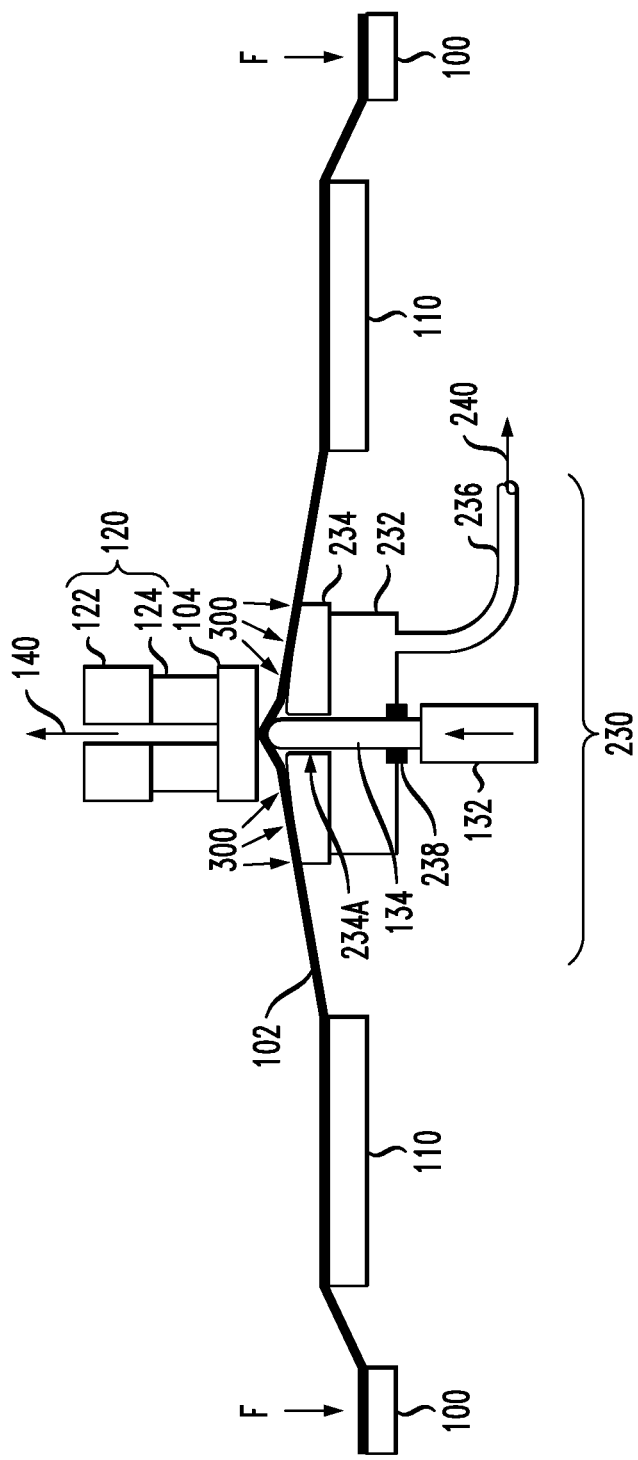

Ramallow thin, fragile semiconductor dies to be removed from wafer tape with reduced tape release forces applied to the semiconductor dies.

PICK AND PLACE TAPE RELEASE FOR THIN SEMICONDUCTOR DIES

TECHNICAL FIELD

This invention generally relates to pick and place tape release techniques and tools that allow thin, fragile semiconductor dies to be removed from wafer tape with reduced tape release forces applied to the semiconductor dies.

BACKGROUND

In the fabrication of semiconductor chips, semiconductor wafers are divided into individual dies, which are then packaged into chips or otherwise mounted onto some intermediate carrier or printed circuit board. This process generally involves two steps, wafer dicing and wafer sorting. In general, wafer dicing involves sawing a wafer into individual dies. In preparation of the wafer dicing process, a wafer is mounted on a cutting ring, placed in a chuck face down, and wafer tape is stretched over the back of the wafer. The tape is evenly distributed onto the wafer using a roller device, and then excess tape is cut away from the ring. Thereafter, the wafer is mounted on chuck for dicing, wherein a diamond blade is used to cut the wafer into individual dies. With the dicing process, the wafer is cut into individual dies without cutting through the wafer tape so that the individual dies remain attached to the wafer tape after the dicing process. The diced wafer is then ready for a wafer sorting process where the individual dies are removed from the wafer tape.

Typically, a semi-automated or fully automated pick and place tool is used to separate the individual dies from the wafer tape. In general, pick and place tools operate by lifting an individual die from the wafer tape and placing the die onto a package, substrate, wafer or other dies (3-D package). With both types (semi-automated and fully automated) of pick and place tools, the wafer tape with the diced wafer is mounted to the tool such that the wafer tape is stretched over a frame. A soft vacuum collet is then placed against an individual die to be removed. Then, one or more eject pins push up through the wafer tape to elevate the die and loosen and dislodge the die from the tape. The vacuum collet then lifts the die from the tape and places the released die into a final package or in an intermediate carrier, for example. With a semi-automatic pick and place tool, a human operator manually turns a series of positioning (XY) knobs to center a target die in the crosshairs displayed on a monitor. The monitor allows the operator to position the pick-up collet over the center of the die. With an automated pick and place tool, the positioning (XY) and centering process is performed automatically using a pattern recognition system.

When using pick and pace tools as described above, significant bending forces can be exerted on a die as the eject pin presses up and the tape pulls down on the edges of the die. These bending forces can cause the die to crack or otherwise break. With semiconductor technologies that use SiGe substrates, or thinning of silicon wafers, the resulting semiconductor dies tend to be fragile. These thin, fragile dies are highly susceptible to cracking and damage due to bending forces exerted on the dies when being separated from wafer tape using conventional pick and place tape release techniques and tools.

SUMMARY OF THE INVENTION

Exemplary embodiments of the invention generally include pick and place tape release techniques and tools that allow thin, fragile semiconductor dies to be removed from wafer tape with reduced tape release forces applied to the semiconductor dies.

In one exemplary embodiment of the invention, a method for removing semiconductor die from wafer tape includes mounting a wafer ring having wafer tape and one or more dies attached to the wafer tape, and aligning an ejector pin assembly under a target die to be removed from the wafer tape. The ejector pin assembly includes a vacuum housing, an ejector pin, a suction plate, and an aperture formed in the suction plate in alignment with the ejector pin. The method further includes generating a vacuum in the vacuum housing to draw the tape against a surface of the suction plate, extending the ejector pin through the vacuum housing out from the aperture of the suction plate to push against a backside of the target die and release the tape from the backside of the target die, and drawing the tape down against the suction plate by suction force of the vacuum as the tape releases from the backside of the target die.

In another exemplary embodiment of the invention, a pick and place tape release tool includes a mounting frame to securely mount a wafer ring having wafer tape and one or more dies attached to the wafer tape, and an ejector pin assembly. The ejector pin assembly includes a vacuum housing, an ejector pin, a suction plate disposed on a top side of the vacuum housing, an aperture formed in the suction plate in alignment with the ejector pin, and a vacuum mechanism to apply a vacuum within the vacuum housing and generate a suction force through the aperture of the suction plate to draw the wafer tape down to the surface of the suction plate.

These and other exemplary embodiments, features and advantages of the present invention will become apparent from the following detailed description of preferred embodiments, which is to be read in conjunction with the accompanying figures.

BRIEF DESCRIPTION OF THE DRAWINGS

FIGS. 1A, 1B, 1C and 1D schematically depict a method for removing semiconductor dies from wafer tape using a standard pick and place tool, to which principles of the present invention may be applied.

FIGS. 2A, 2B, 2C and 2D schematically illustrate a method for releasing semiconductor dies from wafer tape using a pick and place tool, according to aspects of the present invention.

DETAILED DESCRIPTION OF EXEMPLARY EMBODIMENTS

Figure 1B:
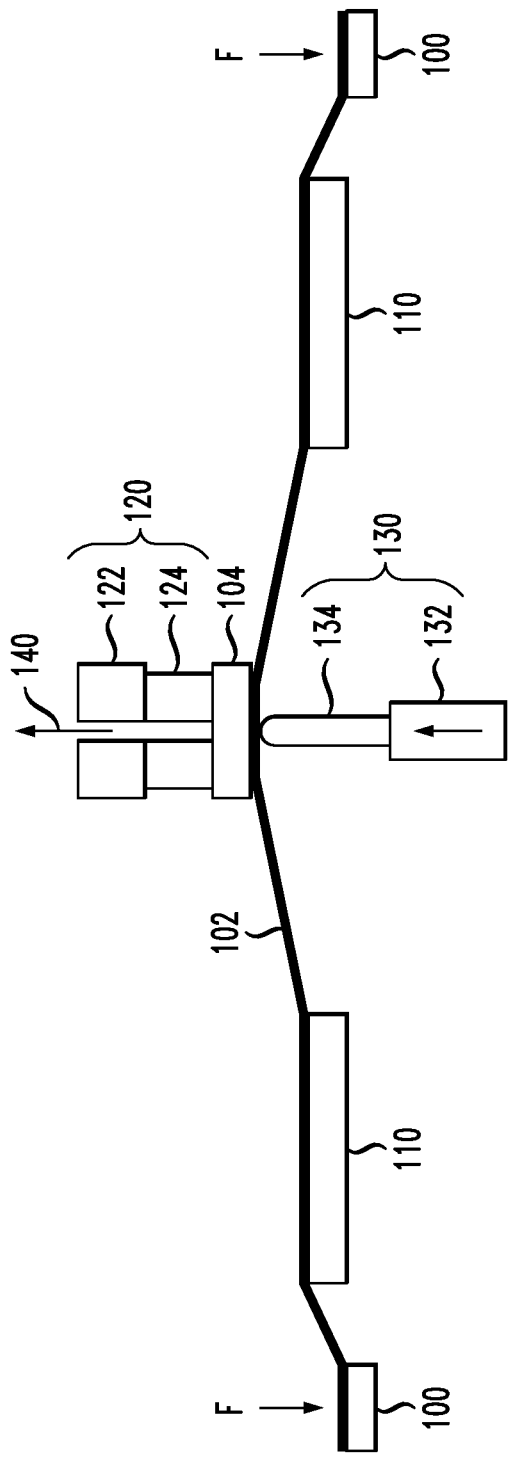

Exemplary embodiments of the invention will now be described in further detail with reference to pick and place tape release techniques and tools that allow thin, fragile semiconductor dies to be removed from wafer tape with reduced tape release forces applied to the semiconductor dies. Initial reference is made to FIGS. 1A, 1B, 1C and 1D, which schematically depict a method for removing semiconductor dies from wafer tape using a standard pick and place tool, to which principles of the present invention may be applied. In particular, FIG. 1A schematically illustrates a wafer frame 100 (ring frame) having adhesive wafer tape 102 with a semiconductor die 104 attached thereto, wherein the wafer frame 100 is mounted in a pick and place tool 10. The pick and place tool 10 comprises a stretching frame 110, a vacuum collet assembly 120 and an ejector pin assembly 130. The vacuum collet assembly 120 comprises a die attach collet 122 and a soft collet tip 124. The ejector pin assembly 130 comprises a pin housing 132 and movable ejector pin 134 that movably extends in and out of the pin housing 132 using a known activation mechanism.

FIG. 1A illustrates an initial step of a die removal process in which the wafer ring 100 (with the wafer tape 102 and die(s) 104 attached thereto) is clamped down in place on the pick and place tool 10 with a clamping force F applied to the top side of the ring 100. In this manner, the wafer tape 102 is further stretched over the frame 110 and tensioned to increase the space between each die 104 on the wafer tape 102 and, therefore, facilitate removal of each individual die 104. It is to be understood that for ease of explanation, only a single die 104 is shown attached to the wafer tape 102 in FIG. 1A, but the wafer tape 102 will have a plurality of individual dies cut from a wafer when initially loaded into the pick and place tool 10.

FIG. 1B schematically illustrates a process to begin removing a die 104 from the adhesive wafer tape 102. As is known in the art, the wafer tape is made with an adhesive of known strength, and the wafer tape can be initially exposed to UV light to break down and weaken the adhesive before or after it is loaded into the pick and place tool 10 using known techniques. To begin a die removal process, the vacuum collet assembly 120 is positioned over the die 104 to be removed and the die attach collet 122 with the soft collet tip 124 is pressed down on the surface of the die 104 so that the collet tip 124 makes contact to the die 104. A vacuum mechanism is then activated to apply a vacuum suction force 140 through a central bore hole which extends through the center of the die attach collet 122 and soft collet tip 124, to thereby suck the die 104 against the soft collet tip 124.

The ejector pin assembly 130 is positioned below the center of the die 104. The ejector pin assembly 130 is then activated to extend the ejector pin 134 from the pin housing 132. The ejector pin 134 begins pushing up through the wafer tape 102 to start raising the die 104 and the vacuum collet assembly 120. As the ejector pin 134 is extended further, the wafer tape 102 become more tensioned/tented, and the die 104 is pushed further up off the surface of the adhesive wafer tape 102. This process causes the wafer tape 102 to peel away from the backside of the die 104 until the die 104 becomes dislodged from the wafer tape 102. Although a single ejector pin 134 is illustrated in FIGS. 1A~1D, it is to be understood that the ejector pin assembly 130 may implement one or more ejector pins depending on the die size and aspect ratio, as is understood by those of ordinary skill in the art.

Figure 1C:
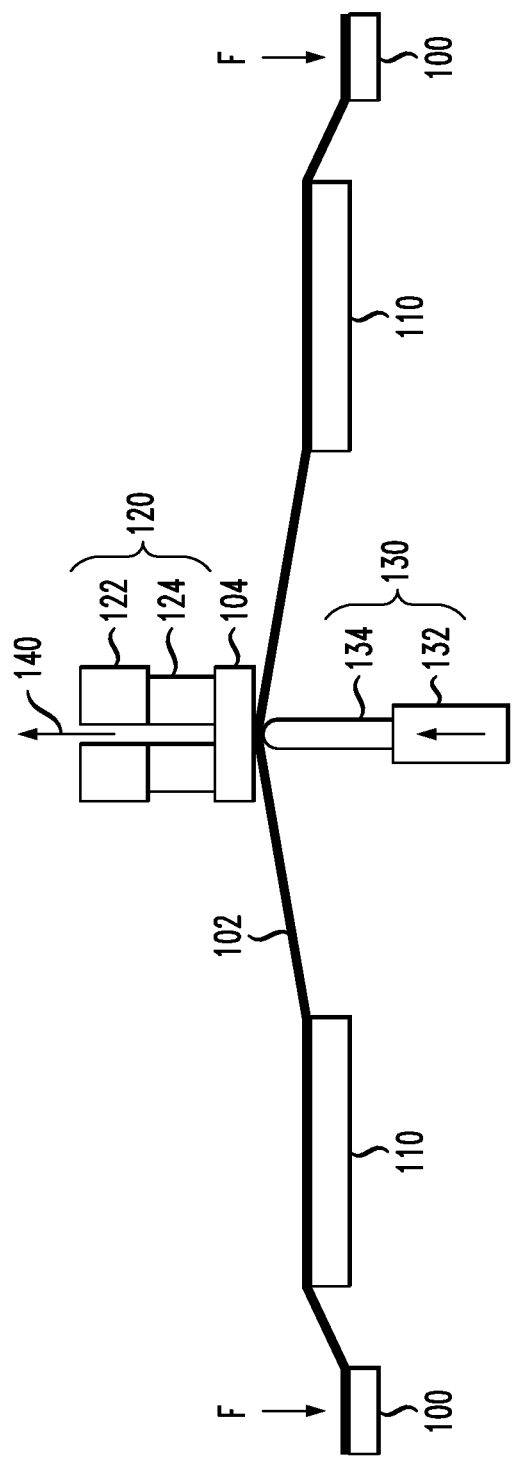

FIG. 1C schematically illustrates a point in the die removal process where the die 104 is essentially dislodged from the adhesive wafer tape 102. At this point, the vacuum force 140 remains activated so that the vacuum collet assembly 120 holds the die 104 as it dislodges from the wafer tape 102. FIG. 1D schematically illustrates a point in the die removal process where the vacuum collet assembly 120 lifts the die 104 from the wafer tape 102, the ejector assembly 130 is activated to withdraw the ejector pin 134 back into the housing 132 and the tensioned wafer tape 120 springs back to its original position. At this point, the released die 104 can be moved by the vacuum collet assembly 120 to another location for mounting.

With the die removal process and tool assembly described above in FIGS. 1A-1D, significant stress may be applied to the perimeter of the die 104 when removing the wafer tape 102, resulting in a stress concentration at central point of the backside of the die 104 which may cause the die 104 to crack or break apart. In particular, a significant amount of force is applied to the die 104 when peeling the tape 102 because the peel angle is small. Indeed, as shown in FIG. 1B, as the tape 102 begins to be peeled off, the tape is nearly parallel to the plane of the die 104 during the onset of the release process. In this regard, the force of the tape 102 pulling at the perimeter edge of the die 104 is essentially parallel to the plane of the die 104, resulting in the edges of the die 104 being pulled down with significant force. With the ejector pin 134 pushing up against the center backside of the die 104, and the tape peeling force pulling down around the perimeter edge of the die 104, there may be a significant stress concentration on the center of the die 104 which may result cracking or otherwise damaging the die 104. For many state of the art semiconductor fabrication techniques, silicon wafers are made very thin, less than 100 microns thick, making the resulting dies very fragile and highly susceptible to breakage or cracking with the die removal techniques shown in FIGS. 1A~1D.

Figure 2C:
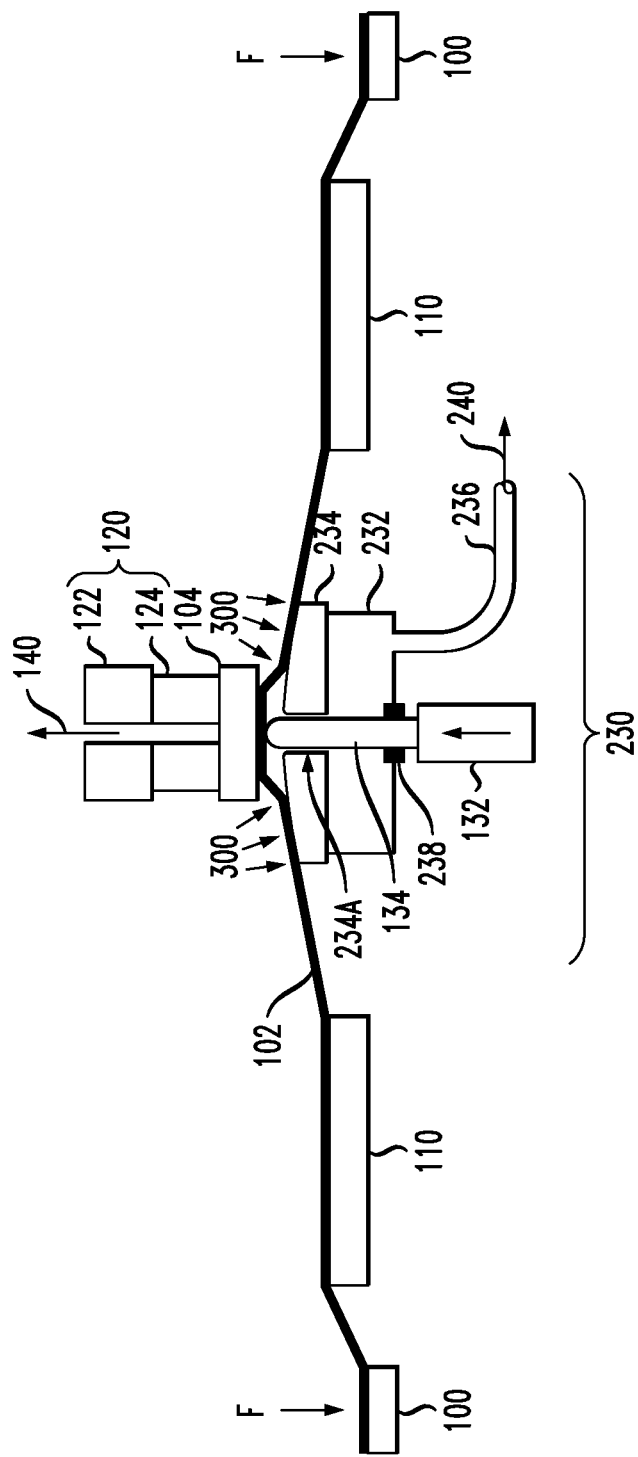

In accordance with exemplary embodiments of the invention as described hereafter, pick and place tape release techniques and tools can be implemented with an improved ejector pin assembly, which allows thin, fragile semiconductor dies to be removed from wafer tape with reduced tape release forces applied to the semiconductor dies. FIGS. 2A, 2B, 2C and 2D schematically illustrate a method for releasing semiconductor dies from wafer tape using a pick and place tool, according to aspects of the present invention. Referring initially to FIG. 2A, a pick and place tool 20 is schematically shown, which is similar to the pick and place tool 10 depicted in FIG. 1A, except for inclusion of an ejector pin assembly 230 which implements a vacuum assembly to draw the wafer tape 102 from the backside of the die 104 by vacuum during a die removal process.

In particular, as depicted in FIG. 2A, the ejector pin assembly 230 comprises a pin housing 132 and movable ejector pin 134 which is similar to the ejector pin assembly 130 discussed above. The ejector pin assembly 230 further comprises a vacuum assembly comprising a vacuum housing 232, a suction plate 234 having an aperture 234A, a vacuum tube 236 and a vacuum sealed aperture 238 formed in a bottom wall of the vacuum housing 232. The ejector pin 132 movably extends through the sealed aperture 238 in the bottom wall of the vacuum housing 232 and through the unsealed aperture 234A in the top suction plate 202. The top surface of the suction plate 234 may be slightly curved as shown, or flat.

FIG. 2A schematically illustrates an initial step of a die removal process (similar to FIG. 1A) in which the wafer ring 100 (with the wafer tape 102 and die(s) 104 attached thereto) is clamped down in place on the pick and place tool 20 with a clamping force F applied to the top side of the ring 100. In this manner, the wafer tape 102 is further stretched over the frame 110 and tensioned to increase the space between each die 104 on the wafer tape 102 and, therefore, facilitate removal of each individual die 104. Again, it is to be understood that for ease of explanation, only a single die 104 is shown attached to the wafer tape 102 in FIG. 2A, but the wafer tape 102 will have a plurality of individual dies cut from a wafer when initially loaded into the pick and place tool 20.

FIG. 2B schematically illustrates a process to begin removing a die 104 from the adhesive wafer tape 102. As in the process discussed above, the wafer tape can be initially exposed to UV light to break down and weaken the adhesive before or after it is loaded into the pick and place tool 20 using known techniques. To begin the die removal process, the ejector pin assembly 230 is aligned to the backside of the die 104 and moved up so that the suction plate 234 makes contact with the backside of the wafer tape 102 below the die 104. In this position, the unsealed aperture 234A in the top suction plate 234 is covered by the wafer tape 102. A vacuum mechanism is activated to create a suction force 240 through the vacuum tube 236 creating a vacuum within the housing 232. The vacuum within housing 232 causes the tape 102 to be sucked down to the top suction plate 234, effectively vacuum sealing the unsealed aperture 234A with the portion of the tape 102 surrounding the aperture 234A. The vacuum collet assembly 120 is positioned over the die 104 to be removed, and the die attach collet 122 with the soft collet tip 124 is pressed down on the surface of the die 104 so that the collet tip 124 makes contact to the die 104.

FIG. 2C schematically illustrates a next step in the die removal process wherein a vacuum mechanism is activated to apply a vacuum suction force 140 through the center of the die attach collet 120 and soft tip 122 to pull the die 104 against the tip 122. The ejector pin assembly 230 is activated to begin extending the ejector pin 134 from the pin housing 132. The ejector pin 132 slides through the sealed aperture 238 (maintaining a vacuum seal) and extends out through the aperture 234A of the suction plate 234 to start raising the die 104 and vacuum collet assembly 120. In this embodiment, a vacuum is maintained in the cavity 232 and a space between the tape 102 and the portion of the top surface of the suction plate 234 surrounding the pin 134 due to the atmospheric pressure 300 pushing the tape 102 down onto the surface of the suction plate 234. In this circumstance, despite the extended movement of the ejector pin 134, a vacuum is maintained by the sealed aperture 238 and the seal created by the tape 102 being pushed down to the suction plate 234 at regions surrounding the aperture 234A.

FIG. 2D schematically illustrates a point in the die removal process where the die 104 is essentially dislodged or released from the tape 102 and the released die 104 can be moved by the vacuum collet assembly 120 to another location for mounting. As depicted in FIGS. 2C and 2D, as the tape 102 is released from the backside of the die 104, the tape 102 is sucked down to the suction plate 234 by virtue of the vacuum created by the suction force 240 and the atmospheric pressure 300 pushing down on the tape 102.

By using the vacuum 240 to pull the wafer tape 102 against the top surface of the suction plate 234 (which may slightly curved (as shown) or flat), the force applied by the tape 102 at the edge of the die 104 is shifted essentially perpendicular to the plane of the die 104, reducing the force needed to peel the tape 102 free from the backside of the die 104. As compared to the die removal process discussed above with reference to FIGS. 1A~1D, less peel force is applied to the die 104 when peeling the tape 102 because the peel angle is much larger (compare small tape peel angle shown in FIG. 1C with larger tape peel angle shown in FIG. 2C). In this regard, the force of the tape 102 pulling at the perimeter edge of the die 104 is reduced, and allows the tape to be peeled off with minimal force.

Moreover, if the suction plate 234 is formed to have a radius of curvature equal to the maximum bending angle tolerated by the die 104, the maximum bend can be constrained as the tape 102 begins to peel. The curvature of the suction plate 234 can be determined as follows. The peak stress can be computed as $$E * \left(\frac{t}{2R}\right),$$

where E denoted the die material (silicon) modulus, t denotes the die thickness, and R denotes the radius of curvature of the plate 234. For a 100 um thick silicon die and an acceptable stress value of 100 MPa, then the plate curvature can be computed to be 100 mm. This curvature means the center height of a 1 cm wide plate would be 0.1 mm above the edges of the plate With regard to the area of the suction plate 234, it is desirable for the atmospheric pressure 300 to hold the tape 102 down against the plate 234 in opposition to the pin release force. Assuming atmospheric pressure is about 10 grams/mm$^2$, 10 mm$^2$ of plate area would be desirable for each 100 grams of release force. This approach is particularly suitable for multi-pin release techniques, as a release can begin near an edge of the die, such that the air than flows under the die during release to help separate the tape 102 from the die 104 near the center where the membrane tension of the tape 102 may be inadequate to pull the tape 102 away from the die 104.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for removing semiconductor die from wafer tape, comprising:
   mounting a wafer ring to a mounting frame, the wafer ring having wafer tape and one or more dies attached to the wafer tape;
   aligning an ejector pin assembly under a target die of the one or more dies to be removed from the wafer tape, the ejector pin assembly comprising a vacuum housing, an ejector pin, an ejector pin housing having an activation mechanism to extend the ejector pin out from the ejector pin housing, a suction plate, and an aperture formed in the suction plate in alignment with the ejector pin;
   generating a vacuum in the vacuum housing to draw the tape against a surface of the suction plate via a suction force applied through the aperture; and
   extending the ejector pin out from the ejector pin housing through the vacuum housing and through the aperture of the suction plate to push against a portion of the wafer tape at a backside of the target die and push said portion of the wafer tape and said target die away from the suction plate, wherein the vacuum force is maintained through the aperture while the ejector pin extends through the aperture to draw the wafer tape toward the suction plate by the suction force of the vacuum applied through the aperture to pull said portion of the wafer tape from the backside of the target die and release said portion of the wafer tape from the backside of the target die while the ejector pin continues to extend and push against the backside of the target die.

2. The method of claim 1, wherein a surface of the suction plate is planar.

3. The method of claim 1, wherein a surface of the suction plate is curved.

4. The method of claim 1, wherein extending the ejector pin through the vacuum housing comprises extending the ejector pin through a sealed aperture on a bottom surface of the vacuum housing opposite the suction plate.

5. The method of claim 1, wherein mounting a wafer ring comprises mounting the wafer ring to a mounting frame which stretches the wafer tape to increase a spacing between the one or more dies attached to the wafer tape.

6. The method of claim 1, further comprising aligning a vacuum collet assembly to a frontside of the target die, and lifting the target die from the wafer tape using vacuum force applied through the vacuum collect assembly.

7. The method of claim 1, wherein the method is implemented in an automated pick and place tool.

8. The method of claim 1, wherein the method is implemented in a semi-automatic pick and place tool.

9. An ejector pin assembly for use with a pick and place tape release tool, comprising:
   a vacuum housing;
   an ejector pin, and an ejector pin housing having an activation mechanism to extend the ejector pin out from the ejector pin housing;
   a suction plate disposed on a top side of the vacuum housing;
   an aperture formed in the suction plate in alignment with the ejector pin; and
   a vacuum mechanism to apply a vacuum within the vacuum housing and generate a suction force through the aperture of the suction plate,
   wherein the ejector pin assembly operates by extending the ejector pin out from the ejector pin housing through the vacuum housing and through the aperture of the suction plate to push against a portion of wafer tape at a backside of a target die adhered to said portion of the wafer tape, and push said portion of the wafer tape and said target die away from the suction plate, wherein the vacuum force is maintained through the aperture while the ejector pin extends through the aperture to draw said portion of the wafer tape toward the suction plate by the suction force of the vacuum applied through the aperture to pull said portion of the wafer tape from the backside of the target die and release said portion of the wafer tape from the backside of the target die while the ejector pin continues to extend and push against the backside of the target die.

10. The ejector pin assembly of claim 9, wherein a surface of the suction plate is planar.

11. The ejector pin assembly of claim 9, wherein a surface of the suction plate is curved.

12. The ejector pin assembly of claim 9, wherein the ejector pin extends through a sealed aperture on a bottom surface of the vacuum housing opposite the suction plate.

13. A pick and place tape release tool, comprising:
   a mounting frame to securely mount a wafer ring having wafer tape and one or more dies attached to the wafer tape; and
   an ejector pin assembly, comprising:
      a vacuum housing;
      an ejector pin, and an ejector pin housing having an activation mechanism to extend the ejector pin out from the ejector pin housing;
      a suction plate disposed on a top side of the vacuum housing;
      an aperture formed in the suction plate in alignment with the ejector pin; and
      a vacuum mechanism to apply a vacuum within the vacuum housing and generate a suction force through the aperture of the suction,
   wherein the ejector pin assembly operates by extending the ejector pin out from the ejector pin housing through the vacuum housing and through the aperture of the suction plate to push against a portion of the wafer tape at a backside of a target die of the one or more dies adhered to said portion of the wafer tape, and push said portion of the wafer tape and said target die away from the suction plate, wherein the vacuum force is maintained through the aperture while the ejector pin extends through the aperture to draw said portion of the wafer tape toward the suction plate by the suction force of the vacuum applied through the aperture to pull said portion of the wafer tape from the backside of the target die and release said portion of the wafer tape from the backside of the target die while the ejector pin continues to extend and push against the backside of the target die.

14. The pick and place tape release tool of claim 13, wherein a surface of the suction plate is planar.

15. The pick and place tape release tool of claim 13, wherein a surface of the suction plate is curved.

16. The pick and place tape release tool of claim 13, wherein the vacuum housing of the ejector pin assembly includes a sealed aperture on a bottom surface of the vacuum housing opposite the suction plate, through which the ejector pin extends.

17. The pick and place tape release tool of claim 13, further comprising a vacuum collet assembly to lift the target die from the wafer tape using vacuum force applied through the vacuum collect assembly.

18. The pick and place tape release tool of claim 13, wherein the pick and place tape release tool is an automated tool.

19. The pick and place tape release tool of claim 13, wherein the pick and place tape release tool is a semi-automated tool.

* * * * *